United States Patent [19]

Kim

[11] Patent Number: 5,691,721
[45] Date of Patent: Nov. 25, 1997

[54] DIGITAL/ANALOG CONVERTER HAVING SEPARATELY FORMED VOLTAGE DIVIDING RESISTANCE REGIONS

[75] Inventor: Sung Soo Kim, Daekukwangyeok-si, Rep. of Korea

[73] Assignee: LG Semicon Co., Ltd., Chungcheongbuk-do, Rep. of Korea

[21] Appl. No.: 536,961

[22] Filed: Sep. 29, 1995

[30] Foreign Application Priority Data

Sep. 30, 1994 [KR] Rep. of Korea ............... 24984/1994

[51] Int. Cl.$^6$ ............................................. H03M 1/78
[52] U.S. Cl. ........................... 341/154; 341/153; 341/146
[58] Field of Search ........................... 341/154, 146, 341/161, 153

[56] References Cited

U.S. PATENT DOCUMENTS

| | | | |
|---|---|---|---|
| 5,093,661 | 3/1992 | Tanimoto | 341/144 |
| 5,175,548 | 12/1992 | Kawada | 341/144 |
| 5,534,862 | 7/1996 | Gross | 341/144 |

FOREIGN PATENT DOCUMENTS

| | | | |
|---|---|---|---|
| 258533 | 11/1986 | Japan | 341/154 |
| 209225 | 8/1988 | Japan | 341/154 |
| 287114 | 11/1988 | Japan | 341/154 |

*Primary Examiner*—Jeffrey A. Gaffin
*Assistant Examiner*—Jason H. Vick
*Attorney, Agent, or Firm*—Morgan, Lewis & Bockius LLP

[57] ABSTRACT

An N bit (where N is an integer) converter having separately formed voltage dividing resistance regions includes a semiconductor substrate of a first conductivity type. (N+1) well regions of a second conductivity type are each formed separately on the semiconductor substrate and an input resistance region of the first conductivity type having a high concentration of impurities is formed in a first well region of the (N+1) well regions. (N−1) ladder resistance regions of the first conductivity type having a high concentration of impurities respectively are formed in (N−1) well regions, each resistance of the (N−1) ladder resistance regions being approximately two times greater than a resistance of the input resistance region. An output resistance region of the first conductivity type having a high concentration of impurities is formed in an (N+1)th well region of the (N+1) well regions, a resistance of the output resistance region being approximately equal to the resistance of the input region. (N+1) impurity diffusion regions of the second conductivity type having a high concentration of impurities are formed in the respective (N+1) well regions, separated from the respective input, ladder, and output resistance regions for applying backward bias voltages to the respective input, ladder, and output resistance regions formed in the (N+1) well regions.

25 Claims, 4 Drawing Sheets

F I G. 2a
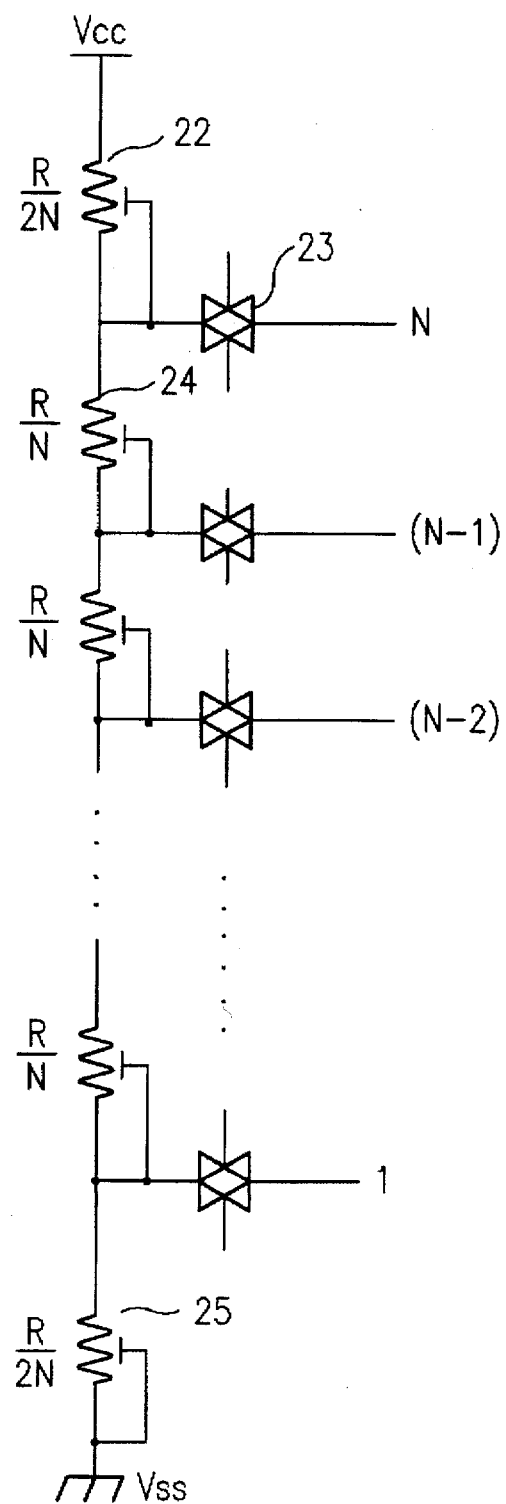

DIGITAL/ANALOG CONVERTER HAVING SEPARATELY FORMED VOLTAGE DIVIDING RESISTANCE REGIONS

BACKGROUND OF THE INVENTION

1. Field of the Invention

The present invention relates to an N bit converter, and more particularly, to an N bit converter having separately formed voltage dividing resistance regions.

2. Discussion of the Related Art

FIGS. 1a and 1b show an embodiment of a conventional digital/analog (D/A) converter, in which FIG. 1a is a circuit diagram, and FIG. 1b is a layout diagram. First, referring to FIG. 1, the conventional D/A converter includes ladder resistances R/N connected in series between a power voltage port Vcc and a ground port Vss, N transfer gates 3 alternately connected between the ladder resistances R/N, an input resistance (R/2N) connected to the power voltage port Vcc as a turn-on resistance, and an output resistance (R/2N) connected to the ground port Vss.

The structure of the conventional D/A converter implemented on a semiconductor integrated circuit (IC) will now be described with reference to FIG. 1b. The conventional D/A converter having voltage dividing resistance regions is formed by implanting high concentration $p^+$ or $n^+$ impurities into a p-type semiconductor substrate 8. A backward bias is applied between the voltage dividing resistance regions 2, 4 and 5 and semiconductor substrate 8, thereby outputting analog signals converted by N transfer gates as the most significant bit (MSB) and the least significant bit (LSB).

That is to say, $n^+$ impurities are ion-implanted into a multiple well region formed on the p-type semiconductor substrate 8 as voltage dividing resistance regions to form ladder resistances (R/N) 4, input resistance (R/2N) 2, and output resistance (R/2N) 5, respectively. Also, p-type layers 7 for applying a backward bias are formed in the well regions of the p-type semiconductor substrate 8 of the voltage dividing resistance regions. Ladder resistance (R/N) 4, input resistance (R/2N) 2 and output resistance (R/2N) 5, which are voltage dividing regions, respectively, are serially connected from power voltage port Vcc to ground port Vss. At this time, a constant bias voltage is connected to semiconductor substrate 8 or p-well 7.

The operation of the aforementioned conventional D/A converter will now be described. If a constant voltage is applied between power voltage port Vcc and ground port Vss and an N-bit digital data is input, a backward bias voltage corresponding to (Vcc−Vss) is applied around a contact hole of the input resistance (R/2N) 2 connected to power voltage port Vcc. Also, a backward bias voltage corresponding to ½N×Vcc−Vss which is smaller than the backward bias voltage (Vcc−Vss), is applied to the terminal around an opposite contact hole of input resistance (R/2N) 2.

Backward bias voltages corresponding to ½N×Vcc−Vss are sequentially applied to ladder resistances (R/N) 4 and 0V bias voltage level is applied to the contact hole of ground port Vss 6 of output resistance (R/2N) 5.

However, according to the conventional D/A converter, the output resistance connected to the ground port Vss is smaller than the input resistance connected to the power voltage port Vcc by the difference in bias voltages applied to the respective voltage dividing resistance contact holes, which considerably influences the conversion accuracy during D/A conversion.

SUMMARY OF THE INVENTION

Accordingly, the present invention is directed to a digital/analog converter having separately formed voltage dividing resistance regions that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly point out in the written description and claims hereof as well as the appended drawings.

To achieve the objects and in accordance with the purpose of the invention, as embodied and broadly described herein, an N bit (where N is an integer) converter having separately formed voltage dividing resistance regions includes a semiconductor substrate of a first conductivity type; (N+1) well regions of a second conductivity type, each formed separately on the semiconductor substrate; an input resistance region of the first conductivity type having a high concentration of impurities formed in a first well region of the (N+1) well regions; (N−1) ladder resistance regions of the first conductivity type having a high concentration of impurities respectively formed in (N−1) well regions, each resistance of the (N−1) ladder resistance regions being approximately two times greater than a resistance of the input resistance region; an output resistance region of the first conductivity type having a high concentration of impurities formed in an (N+1)th well region of the (N+1) well regions, a resistance of the output resistance region being approximately equal to the resistance of the input region; and (N+1) impurity diffusion regions of the second conductivity type having a high concentration of impurities formed in the respective (N+1) well regions, separated from the respective input, ladder, and output resistance regions for applying backward bias voltages to the respective input, ladder, and output resistance regions formed in the (N+1) well regions.

In another aspect of the invention, a converter includes a semiconductor substrate of a first conductivity type; a plurality of well regions of a second conductivity type, each formed separately on the semiconductor substrate; an input resistance region of the first conductivity type formed in one of the well regions; ladder resistance regions of the first conductivity type respectively formed in the well regions; an output resistance region of the first conductivity type formed in another one of the well regions; and a plurality of impurity diffusion regions of the second conductivity type formed in the well regions, respectively, separated from the input, ladder, and output resistance regions, respectively, for applying backward bias voltages to the respective input, ladder, and output resistance regions.

In a further aspect of the invention, an N bit (where N is an integer) converter having separately formed voltage dividing resistance regions includes a semiconductor substrate of a first conductivity type; (N+1) well regions of a second conductivity type, each formed separately on the semiconductor substrate; an input resistance region of the first conductivity type formed in one of the (N+1) well regions; (N−1) ladder resistance regions of the first conductivity type formed in respective well regions; an output resistance region of the first conductivity type formed in another one of the (N+1) well regions; and (N+1) impurity diffusion regions of the second conductivity type formed in the well regions, respectively, separated from the input, ladder, and output resistance regions, respectively, for applying backward bias voltages to the respective input, ladder, and output resistance regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate embodiments of the invention and, together with the description, serve to explain the principles of the invention.

In the drawings:

FIG. 2a is a circuit diagram of a D/A converter having separately formed voltage dividing resistance regions according to the present invention.

DETAILED DESCRIPTION OF THE PREFERRED EMBODIMENT

Reference will now be made in detail to the present preferred embodiments of the invention, examples of which are illustrated in the accompanying drawings.

Figure 1A:
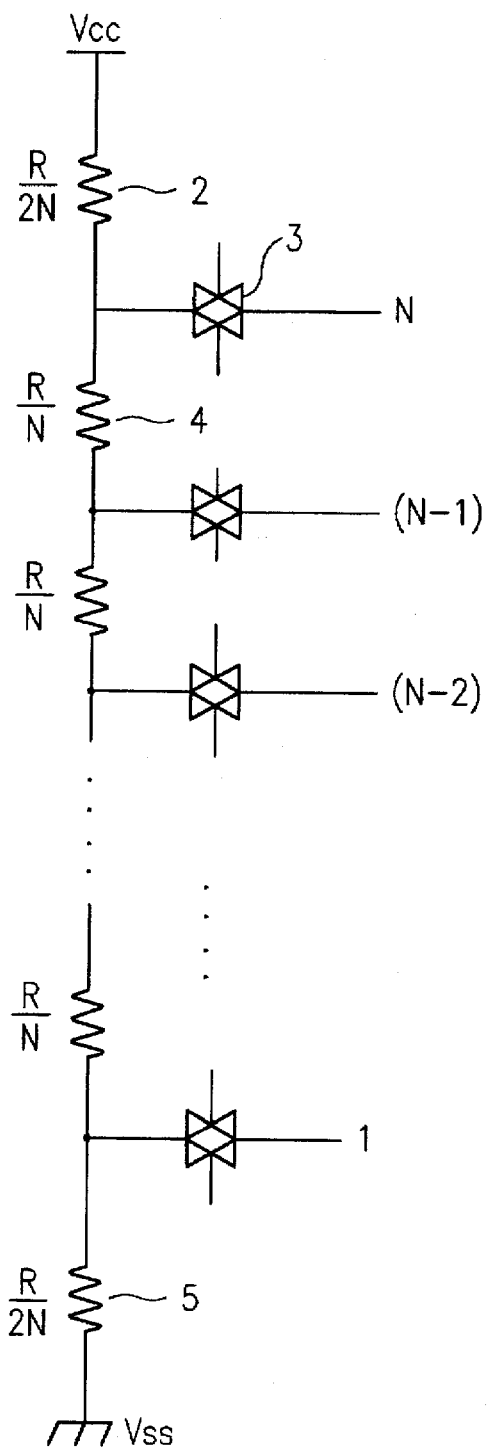
FIG. 1a is a circuit diagram of a conventional D/A converter.
Figure 1B:
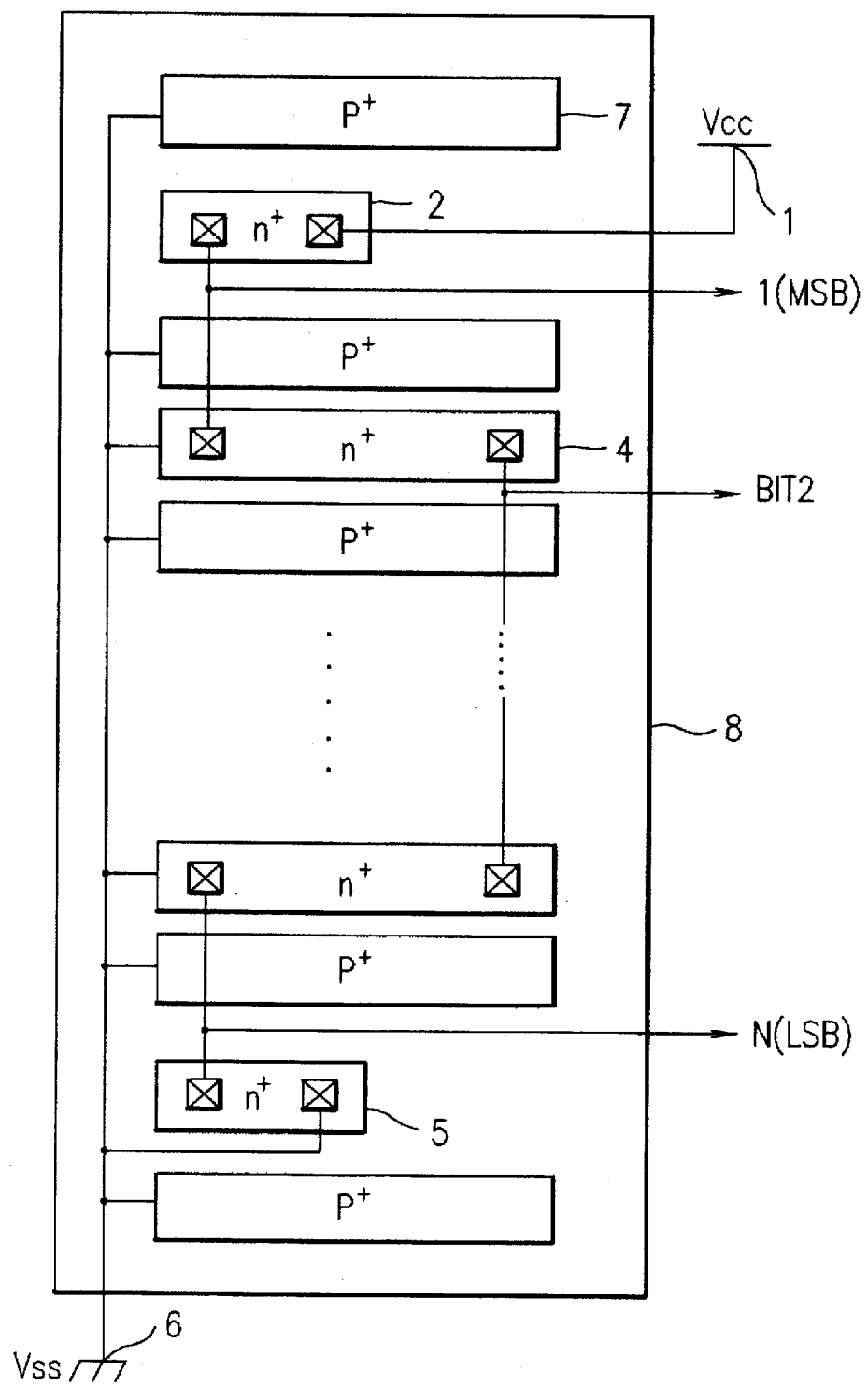
FIG. 1b is a layout diagram of a conventional D/A converter.
Figure 2B:
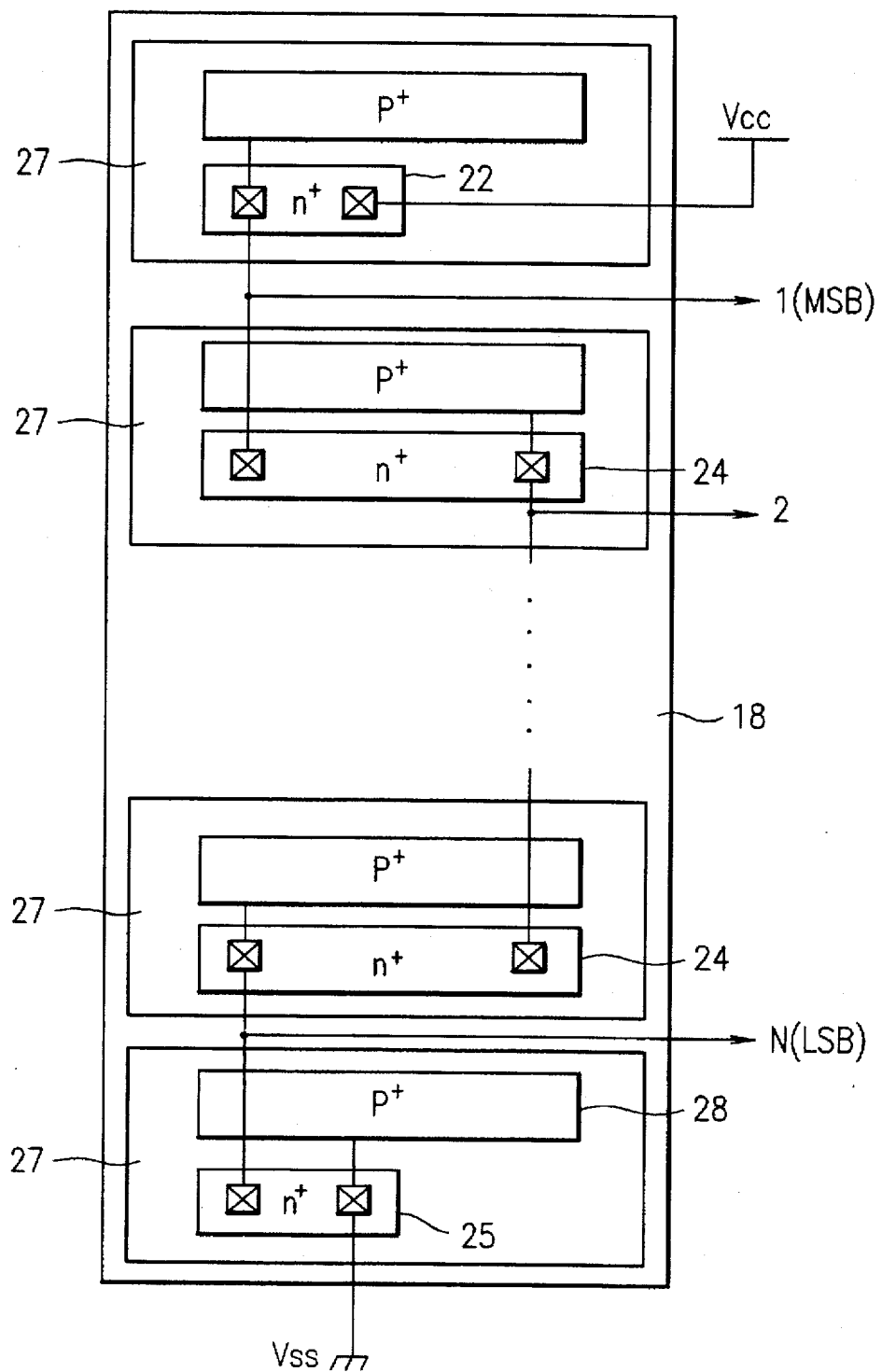
FIG. 2b is a layout diagram of a D/A converter having separately formed voltage dividing resistance regions according to the present invention.

Referring to FIGS. 2a and 2b, a D/A converter according to the present invention has voltage dividing resistances that are separately formed on respective well regions so that an analog voltage is precisely distributed by input digital data. The D/A converter according to the present invention includes N+1 (where N is an integer) well regions 27 of a second conductivity type separately formed on a semiconductor substrate 18 of a first conductivity type. Input resistance (R/2N) region 22 is formed by ion-implanting impurities of a first conductivity type to a high concentration into a first well region among the N+1 well regions 27 of a second conductivity. N−1 ladder resistance (R/N) regions 24 are formed by implanting impurities of a first conductivity to a high concentration from a second well region to an Nth well region. Output resistance (R/2N) region 25 is formed by implanting impurities of a first conductivity having high concentration into an (N+1)th well region. N+1 impurity diffusion regions (p$^+$ regions) 28 are separately formed by ion-implanting impurities of a second conductivity to a high concentration in the respective resistance regions 22, 24 and 25 for applying backward bias voltages to the respective resistance regions formed in the N+1 well regions 27 of a second conductivity.

At this time, a first contact hole and a second contact hole are respectively formed at both ends of the respective resistance regions 22, 24 and 25 and electrically interconnected to adjacent resistance regions by metal lines. N analog output ports of MSB to LSB corresponding to the respective bits are connected to the metal lines. Power voltage Vcc is applied to a first contact hole of input resistance (R/2N) region 22, and ground voltage Vss is applied to a second contact hole of output resistance (R/2N) region 25. N+1 impurity diffusion regions 28 separately formed by ion-implanting impurities of a second conductivity type to a high concentration, corresponding to resistance regions 22, 24 and 25, are respectively connected to second contact holes of resistance regions 22, 24 and 25.

If power voltage Vcc is applied to the D/A converter having separately formed voltage dividing resistance regions according to the present invention, a backward bias voltage corresponding to ½N×Vcc is applied around the first contact hole of the first well region 27 of a second conductivity which contains input resistance (R/2N) region 22, and 0V bias voltage is applied around the second contact hole to which the analog output port corresponding to the MSB is connected. Also, a backward bias voltage corresponding to 1/N×Vcc is applied around the first contact hole of the second well region 27 of a second conductivity and 0V bias voltage is applied around the second contact hole.

That is, the backward bias voltage corresponding to ½N×Vcc is applied around the first contact hole of the first well region 27 of a second conductivity connected to power voltage Vcc port, and 0V bias voltage is applied around the second contact hole, respectively. Also, the backward bias voltage corresponding to 1/N×Vcc and 0V bias voltage are uniformly applied around the first and second contact holes of the remaining N−1 well regions 27 of a second conductivity, respectively.

In such a manner, upon the application of power voltage Vcc, uniform backward bias voltage and 0V bias voltage are applied around the first and second contact holes of the remaining N−1 well regions 27 of a second conductivity, respectively, and paths that are tied to ground voltage are formed. Hence, input digital data is uniformly converted to analog data through transfer gates 23 without changing levels from MSB to LSB.

Therefore, according to the present invention, the conversion accuracy of analog data with respect to the input digital data can be improved.

The aforementioned D/A converter having separately formed voltage dividing resistance regions forms voltage dividing resistances in separately formed well regions. Thus, a precise voltage division occurs because backward bias voltages applied to the respective voltage dividing resistances and the respective wells are the same, thereby improving the conversion accuracy.

Moreover, since the D/A converter having separately formed voltage dividing resistance regions according to the present invention uses impurities adjusted in concentration in the voltage dividing resistances of separately formed well regions, the conversion accuracy is improved.

It will be apparent to those skilled in the art that various modifications and variations can be made in the converter having separately formed voltage dividing resistance regions of the present invention without departing from the spirit or scope of the invention. Thus, it is intended that the present invention cover the modifications and variations of this invention provided they come within the scope of the appended claims and their equivalents.

What is claimed is:

1. An N bit (where N is an integer) converter having separately formed voltage dividing resistance regions comprising:

a semiconductor substrate of a first conductivity type;

(N+1) well regions of a second conductivity type, each formed separately on the semiconductor substrate;

an input resistance region of the first conductivity type having a high concentration of impurities formed in a first well region of the (N+1) well regions;

(N−1) ladder resistance regions of the first conductivity type having a high concentration of impurities respectively formed in (N−1) well regions, each resistance of the (N−1) ladder resistance regions being approximately two times greater than a resistance of the input resistance region;

an output resistance region of the first conductivity type having a high concentration of impurities formed in an (N+1)th well region of the (N+1) well regions, a resistance of the output resistance region being approximately equal to the resistance of the input region; and (N+1) impurity diffusion regions of the second conductivity type having a high concentration of impurities formed in the respective (N+1) well regions, separated from the respective input, ladder, and output resistance regions for applying backward bias voltages to the respective input, ladder, and output resistance regions formed in the (N+1) well regions.

2. The converter having separately formed voltage dividing resistance regions according to claim 1, further comprising:

a first contact hole and a second contact hole respectively formed at both ends of each of the input resistance region, the ladder resistance regions, and the output resistance region;

conductive lines electrically connecting adjacent resistance regions; and

N analog output ports corresponding to the respective N bits connected to the conductive lines.

3. The converter having separately formed voltage dividing resistance regions according to claim 2, further comprising a voltage port connected to the first contact hole of the input resistance region.

4. The converter having separately formed voltage dividing resistance regions according to claim 2, further comprising a ground port connected to the second contact hole of the output resistance region.

5. The converter having separately formed voltage dividing resistance regions according to claim 2, wherein the (N+1) impurity diffusion regions in the respective (N+1) well regions are respectively connected to the second contact holes of the respective input, ladder, and output resistance regions.

6. The converter having separately formed voltage dividing resistance regions according to claim 1, wherein the (N−1) ladder resistance regions are formed between the input and output resistance regions.

7. The converter having separately formed voltage dividing resistance regions according to claim 1, wherein the converter is a digital-to-analog converter.

8. The converter having separately formed voltage dividing resistance regions according to claim 1, wherein the converter is an analog-to-digital converter.

9. A converter comprising:

a semiconductor substrate of a first conductivity type;

a plurality of well regions of a second conductivity type, each formed separately on the semiconductor substrate;

an input resistance region of the first conductivity type formed in one of the well regions;

ladder resistance regions of the first conductivity type respectively formed in the well regions;

an output resistance region of the first conductivity type formed in another one of the well regions; and a plurality of impurity diffusion regions of the second conductivity type formed in the well regions, respectively, separated from the input, ladder, and output resistance regions, respectively, for applying backward bias voltages to the respective input, ladder, and output resistance regions.

10. The converter according to claim 9, wherein the converter includes separately formed voltage dividing resistance regions.

11. The converter according to claim 9, wherein each of the ladder resistance regions has a resistance greater than a resistance of the input resistance region.

12. The converter according to claim 9, wherein each of the ladder resistance regions has a resistance approximately two times greater than a resistance of the input resistance region.

13. The converter according to claim 9, wherein each of the ladder resistance regions has a resistance greater than a resistance of the output resistance region.

14. The converter according to claim 9, wherein each of the ladder resistance regions has a resistance approximately two times greater than a resistance of the output resistance region.

15. The converter according to claim 9, wherein the output resistance region a resistance approximately equal to a resistance of the input region.

16. The converter according to claim 9, wherein a number of the well regions is equal to a number of the impurity diffusion regions.

17. The converter according to claim 9, wherein the input resistance regions, the ladder resistance regions and the output resistance region have a high concentration of impurities.

18. The converter according to claim 9, further comprising:

a first contact hole and a second contact hole respectively formed at both ends of each of the input resistance region, the ladder resistance regions, and the output resistance region; conductive lines electrically connecting adjacent resistance regions; and analog output ports coupled to the conductive lines.

19. The converter according to claim 18, further comprising a voltage port connected to the first contact hole of the input resistance region.

20. The converter according to claim 18, further comprising a ground port connected to the second contact hole of the output resistance region.

21. The converter according to claim 18, wherein the impurity diffusion regions in the respective well regions are respectively connected to the second contact holes of the respective input, ladder, and output resistance regions.

22. The converter according to claim 9, wherein the ladder resistance regions are formed between the input and output resistance regions.

23. The converter having separately formed voltage dividing resistance regions according to claim 9, wherein the converter is a digital-to-analog converter.

24. The converter having separately formed voltage dividing resistance regions according to claim 9, wherein the converter is an analog-to-digital converter.

25. An N bit (where N is an integer) converter having separately formed voltage dividing resistance regions comprising:

a semiconductor substrate of a first conductivity type;

(N+1) well regions of a second conductivity type, each formed separately on the semiconductor substrate;

an input resistance region of the first conductivity type formed in one of the (N+1) well regions;

(N−1) ladder resistance regions of the first conductivity type formed in respective well regions;

an output resistance region of the first conductivity type formed in another one of the (N+1) well regions; and (N+1) impurity diffusion regions of the second conductivity type formed in the well regions, respectively, separated from the input, ladder, and output resistance regions, respectively, for applying backward bias voltages to the respective input, ladder, and output resistance regions.

* * * * *